(12) United States Patent
Yu

(10) Patent No.: US 12,107,115 B2
(45) Date of Patent: Oct. 1, 2024

(54) DISPLAY PANEL

(71) Applicant: Wuhan China Star Optoelectronics Semiconductor Display Technology Co., Ltd., Wuhan (CN)

(72) Inventor: Haijun Yu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/622,129

(22) PCT Filed: Dec. 7, 2021

(86) PCT No.: PCT/CN2021/136207
§ 371 (c)(1),
(2) Date: Dec. 22, 2021

(87) PCT Pub. No.: WO2023/092651
PCT Pub. Date: Jun. 1, 2023

(65) Prior Publication Data
US 2024/0030271 A1   Jan. 25, 2024

(30) Foreign Application Priority Data
Nov. 24, 2021   (CN) .......................... 202111404704.1

(51) Int. Cl.
*H01L 27/15*   (2006.01)

(52) U.S. Cl.
CPC .................... *H01L 27/156* (2013.01)

(58) Field of Classification Search
CPC ...................................... H01L 27/156
USPC ........................................... 313/505
See application file for complete search history.

(56) References Cited

U.S. PATENT DOCUMENTS

| 2011/0012820 | A1  | 1/2011  | Kim et al. |                       |
|--------------|-----|---------|------------|-----------------------|
| 2014/0071030 | A1* | 3/2014  | Lee        | H10K 59/353 345/82    |
| 2015/0192834 | A1* | 7/2015  | Morinaga   | G02F 1/136213 349/39  |
| 2015/0348470 | A1* | 12/2015 | Wang       | G09G 3/2003 345/694   |
| 2017/0323592 | A1* | 11/2017 | Hughes     | G09G 3/2088           |
| 2020/0135123 | A1  | 4/2020  | Hu et al.  |                       |
| 2023/0240111 | A1* | 7/2023  | Lan        | H10K 59/352 257/40    |
| 2023/0247883 | A1* | 8/2023  | Guan       | H10K 59/353 257/40    |

* cited by examiner

*Primary Examiner* — Christopher M Raabe
(74) *Attorney, Agent, or Firm* — Nathan & Associates; Menachem Nathan

(57) ABSTRACT

A display panel includes first sub-pixels, second sub-pixels and third sub-pixels. Each pixel unit includes a first sub-pixel, a second sub-pixel and two third sub-pixels disposed in a virtual octagon. The two third sub-pixels are distributed on two opposite sides of a pixel column constituted by the first sub-pixel and the second sub-pixel.

20 Claims, 4 Drawing Sheets

DISPLAY PANEL

FIELD OF INVENTION

This disclosure relates to a technical field of a display, and more particularly to a display panel.

BACKGROUND OF INVENTION

At present, organic light-emitting diode (OLED) displays have shown off. Compared with the conventional liquid crystal display, the OLED display has the advantages including the high color gamut, the wide viewing angle, the fast response and the capability of being made into a flexible device, may be applied to wearable devices, such as a smart wristband, a smart watch and a virtual reality (VR) apparatus, and may also be applied to various fields of devices, such as a mobile phone, an electronic book, an electronic newspaper, a television, a personal portable computer and the like. As the OLED technology matures, the display market share occupied by the OLED is constantly increased, and the OLED particularly obtains the larger development in the display panel market of the mobile phone. A display frame of the OLED technology is formed by more than one base color, and each base color is composed of tens of thousands of pixels. At present, pixels in a medium size display panel and a large-size display panel are mainly arranged in a real RGB mode. That is, each sub-pixel is configured independently according to a certain distribution law. In this mode, the display panel has the low pixel density, the poor resolution, and the display picture quality that is not high.

Therefore, the pixel arrangement of the current display panel causes the technical problems of the low pixel density and the poor resolution.

SUMMARY OF INVENTION

Technical Problems

This disclosure provides a display panel for relieving the technical problem, such as the low pixel density of the display panel, caused by the current pixel arrangement.

Technical Solutions

This disclosure provides a display panel including: multiple first sub-pixels displaying a first color, multiple second sub-pixels displaying a second color, and multiple third sub-pixels displaying a third color;
wherein the display panel further includes multiple pixel units each including one of the first sub-pixels, one of the second sub-pixels and two of the third sub-pixels disposed in a virtual octagon;
wherein in each of the pixel units, the first sub-pixel is adjacent to the second sub-pixel in a first direction, and two of the third sub-pixels are arranged in a second direction and disposed on two opposite sides of a pixel column constituted by the first sub-pixel and the second sub-pixel;
wherein the display panel includes: a first pixel unit and a second pixel unit arranged and adjacent to each other in the first direction, and a third pixel unit adjacent to the first pixel unit and the second pixel unit concurrently, wherein the first pixel unit and the third pixel unit share one of the third sub-pixels, and the second sub-pixel of the first pixel unit is adjacent to the first sub-pixel of the second pixel unit.

In the display panel of this disclosure, the first sub-pixel of the second pixel unit is adjacent to the first sub-pixel of the third pixel unit.

In the display panel of this disclosure, the first pixel unit and the second pixel unit does not share the first sub-pixel or the second sub-pixel.

In the display panel of this disclosure, an arrangement direction of the first sub-pixel and the second sub-pixel in the first pixel unit is opposite to an arrangement direction of the first sub-pixel and the second sub-pixel in the third pixel unit.

In the display panel of this disclosure, in each of the pixel units, areas of two of the third sub-pixels are equal to each other, and an area of the first sub-pixel is greater than an area of the second sub-pixel.

In the display panel of this disclosure, in each of the pixel units, a distance from a geometric center of each of the third sub-pixels to a geometric center of the first sub-pixel is greater than a distance from the geometric center of the third sub-pixel to a geometric center of the second sub-pixel.

In the display panel of this disclosure, in each of the pixel units, the first sub-pixel is symmetrical about a connection line connecting the geometric center of the first sub-pixel to the geometric center of the second sub-pixel, the second sub-pixel is symmetrical about the connection line connecting the geometric center of the first sub-pixel to the geometric center of the second sub-pixel, and two of the third sub-pixels are symmetrical about the connection line connecting the geometric center of the first sub-pixel to the geometric center of the second sub-pixel.

In the display panel of this disclosure, the virtual octagon includes two first sides parallel to the first direction, two second sides parallel to the second direction, and four third sides sequentially connecting the two first sides to the two second sides; and two of the third sub-pixels are respectively disposed close to the two first sides, and the first sub-pixel and the second sub-pixel are respectively disposed close to the two second sides.

In the display panel of this disclosure, the first sub-pixel has a polygonal, circular or elliptic shape, the second sub-pixel has a polygonal, circular or elliptic shape, and the third sub-pixel has a polygonal, circular or elliptic shape.

In the display panel of this disclosure, the first sub-pixel has a hexagonal shape, and each of the second sub-pixel and the third sub-pixel has a tetragonal shape.

In the display panel of this disclosure, the virtual octagon is a regular octagon, the second sub-pixel has a rectangular shape, and the third sub-pixel has a parallelogram shape; and a coincident region between the virtual octagon where the first pixel unit is located and the virtual octagon where the third pixel unit is located has a parallelogram shape.

In the display panel of this disclosure, the virtual octagon is a regular octagon, the first sub-pixel has a hexagonal shape, the second sub-pixel has a circular shape, and the third sub-pixel has a parallelogram shape; and a coincident region between the virtual octagon where the first pixel unit is located and the virtual octagon where the third pixel unit is located has a parallelogram shape.

In the display panel of this disclosure, the display panel further includes support posts disposed between the first sub-pixels and the second sub-pixels.

In the display panel of this disclosure, each of the support posts is disposed on a connection line connecting a geometric center of the first sub-pixel to a geometric center of the second sub-pixel.

In the display panel of this disclosure, the support posts are disposed in the pixel units.

In the display panel of this disclosure, a ratio of a number of the support posts to a number of the first sub-pixels is equal to 1:1 in the overall display panel.

In the display panel of this disclosure, each of the support posts is disposed between two of the pixel units adjacent to each other in the first direction.

In the display panel of this disclosure, a ratio of a number of the support posts to a number of the first sub-pixels is equal to 1:2 in the overall display panel.

In the display panel of this disclosure, the first sub-pixel is a red sub-pixel, the second sub-pixel is a blue sub-pixel, and the third sub-pixel is a green sub-pixel.

This disclosure further provides a display panel including multiple first sub-pixels displaying a first color, multiple second sub-pixels displaying a second color, and multiple third sub-pixels displaying a third color. The display panel further includes multiple pixel units each including one of the first sub-pixels, one of the second sub-pixels and two of the third sub-pixels disposed in a virtual octagon. In each of the pixel units, the first sub-pixel is adjacent to the second sub-pixel in a first direction, and two of the third sub-pixels are arranged in a second direction and disposed on two opposite sides of a pixel column constituted by the first sub-pixel and the second sub-pixel. The display panel includes: a first pixel unit and a second pixel unit arranged and adjacent to each other in the first direction; and a third pixel unit adjacent to the first pixel unit and the second pixel unit concurrently. The first pixel unit and the third pixel unit share one of the third sub-pixels. The second sub-pixel of the first pixel unit is adjacent to the first sub-pixel of the second pixel unit, and the first sub-pixel of the second pixel unit is adjacent to the first sub-pixel of the third pixel unit. An arrangement direction of the first sub-pixel and the second sub-pixel in the first pixel unit is opposite to an arrangement direction of the first sub-pixel and the second sub-pixel in the third pixel unit.

Beneficial Effects

This disclosure provides a display panel including multiple first sub-pixels, multiple second sub-pixels, and multiple third sub-pixels, and the display panel further includes multiple pixel units. The pixel unit includes a first sub-pixel, a second sub-pixel and two third sub-pixels disposed in a virtual octagon. Two third sub-pixels are distributed on two opposite sides of a pixel column constituted by the first sub-pixel and the second sub-pixel. The display panel includes: a first pixel unit and a second pixel unit arranged in a first direction and adjacent to each other, and a third pixel unit adjacent to the first pixel unit and the second pixel unit concurrently, wherein the first pixel unit and the third pixel unit share one of the third sub-pixels, and the second sub-pixel of the first pixel unit is adjacent to the first sub-pixel of the second pixel unit. The embodiment of this disclosure is configured to provide pixel units having octagon structures, make two third sub-pixels in each pixel unit be distributed on two opposite sides of a pixel column constituted by the first sub-pixel and the second sub-pixel, and make the first pixel unit and the third pixel unit share one of the third sub-pixels, so that the display panel having the pixel structure can implement close packing of multiple pixel units, and the pixel density and the display resolution of the display panel can be thus increased.

DESCRIPTION OF DRAWINGS

In order to illustrate the technical solutions more clearly in the embodiments or the prior art, the drawings needed in the description of the embodiments or the prior art will be briefly introduced in the following. Obviously, the drawings in the following description just show some examples of this disclosure. For those of ordinary skill in the art, other drawings can be obtained from these drawings without creative works.

DETAILED DESCRIPTION OF EMBODIMENTS

Figure 1:
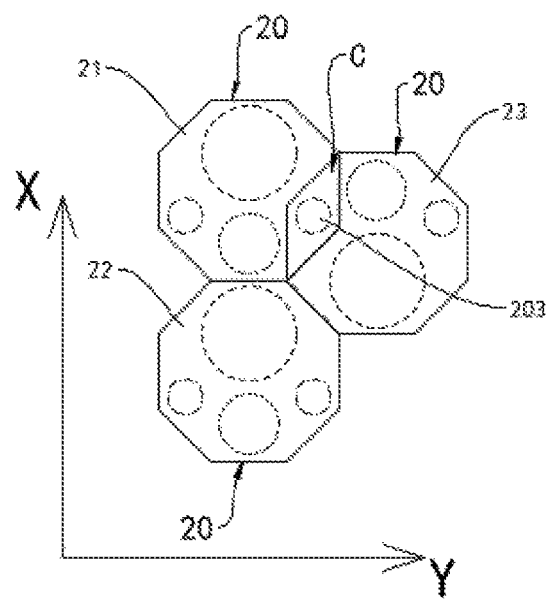
FIG. 1 is a schematic structure view showing adjacent three pixel units in a display panel provided by an embodiment of this disclosure.

The descriptions of the following embodiments are made with reference to the attached drawings to illustrate specific embodiments that can be implemented in this disclosure. Directional terms, such as "top," "bottom," "front," "rear," "left," "right," "inner," "outer," "side," and the like, mentioned in this disclosure only refer to the directions of the accompanying drawings. Therefore, the direction terms are used to explain and understand this disclosure, but not to limit this disclosure. In the drawings, units with similar structures are indicated by the same reference number.

An embodiment of this disclosure provides a display panel, which includes multiple first sub-pixels displaying a first color, multiple second sub-pixels displaying a second color, and multiple third sub-pixels displaying a third color. The display panel further includes multiple pixel units, which includes one of the first sub-pixels, one of the second sub-pixels and two of the third sub-pixels disposed in a virtual octagon, wherein two of the third sub-pixels are distributed on two opposite sides of a pixel column constituted by the first sub-pixel and the second sub-pixel. The display panel includes: a first pixel unit and a second pixel unit arranged in a first direction and adjacent to each other, and a third pixel unit adjacent to the first pixel unit and the second pixel unit concurrently, wherein the first pixel unit and the third pixel unit share one of the third sub-pixels, and the second sub-pixel of the first pixel unit is adjacent to the first sub-pixel of the second pixel unit. The embodiment of this disclosure is configured to provide pixel units having octagon structures, make two third sub-pixels in each pixel unit be distributed on two opposite sides of a pixel column constituted by the first sub-pixel and the second sub-pixel, and make the first pixel unit and the third pixel unit share one of the third sub-pixels, so that the display panel having the pixel structure can implement close packing of multiple pixel units, and the pixel density and the display resolution of the display panel can be thus increased.

Figure 2:
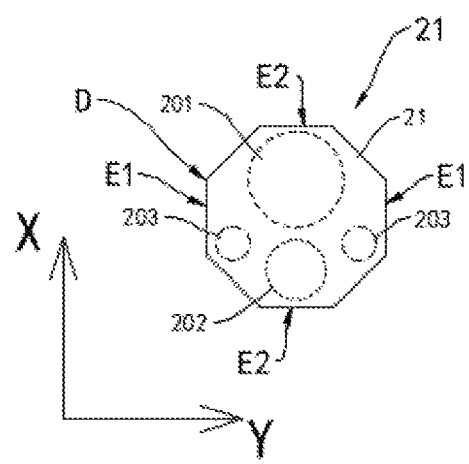
FIG. 2 is a schematic structure view showing a first pixel unit in the pixel unit of FIG. 1.
Figure 3:
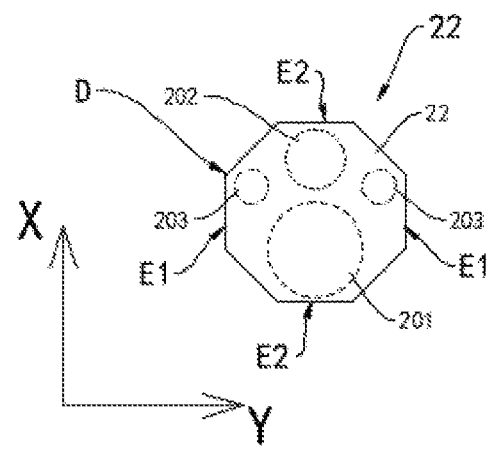
FIG. 3 is a schematic structure view showing a third pixel unit in the pixel unit of FIG. 1.

Referring to FIGS. 1 to 3. FIG. 1 is a schematic structure view showing adjacent three pixel units in a display panel provided by an embodiment of this disclosure. FIG. 2 is a schematic structure view showing a first pixel unit in the pixel unit of FIG. 1. FIG. 3 is a schematic structure view showing a third pixel unit in the pixel unit of FIG. 1.

This embodiment provides a display panel, which includes: multiple first sub-pixels 201 displaying a first color, multiple second sub-pixels 202 displaying a second color, and multiple third sub-pixels 203 displaying a third color, wherein the first color, the second color and the third color may be any one of red, green and blue colors, respectively.

Optionally, the first sub-pixel 201 is a red sub-pixel, the second sub-pixel 202 is a blue sub-pixel, and the third sub-pixel 203 is a green sub-pixel.

The display panel further includes multiple pixel units 20. Each of the pixel units 20 is disposed in a virtual octagon D, and includes: one of the first sub-pixels 201, one of the second sub-pixels 202, and two of the third sub-pixels 203. In the same pixel unit 20, the second sub-pixel 202 and the first sub-pixel 201 in the pixel unit 20 are arranged in a first direction X; and the two of the third sub-pixels 203 are arranged in a second direction Y and disposed on two opposite sides of a pixel column constituted by the first sub-pixel 201 and the second sub-pixel 202 in the pixel unit 20, respectively. Each pixel unit 20 is configured to have the octagon structure in this embodiment, and four sub-pixels are disposed in each pixel unit 20, so that two of the third sub-pixels 203 in each pixel unit 20 are distributed on two opposite sides of a pixel column constituted by the first sub-pixel 201 and the second sub-pixel 202, and the structure of the pixel unit 20 is beneficial to the implementation of close packing of multiple pixel units in the display panel and the increase of the pixel density and the display resolution of the display panel.

Further, the display panel includes: a first pixel unit 21 and a second pixel unit 22 arranged and adjacent to each other in the first direction X, and a third pixel unit 23 adjacent to the first pixel unit 21 and the second pixel unit 22 concurrently. A partial area of the first pixel unit 21 coincides with a partial area of the third pixel unit 23 to form a coincident region C containing one of the third sub-pixels 203.

Further, the circuit connection relationship can be adjusted make the display panel perform the display function, and make the first pixel unit 21 and the third pixel unit 23 share one of the third sub-pixels 203 in the coincident region C, wherein no sub-pixel sharing is present between the first pixel unit 21 and the second pixel unit 22, and the second sub-pixel 202 of the first pixel unit 21 is adjacent to the first sub-pixel 201 of the second pixel unit 22. Using the above-mentioned configurations may further enhance the display resolution and the frame saturation of the display panel.

In this embodiment, the first sub-pixel 201 of the second pixel unit 22 is adjacent to the first sub-pixel 201 of the third pixel unit 23, thereby further implementing close packing of sub-pixels in the display panel, and it is beneficial to the further increase of the pixel density, the display resolution and the frame saturation of the display panel.

Further, the virtual octagon D includes two first sides E1 parallel to the first direction X, two second sides E2 parallel to the second direction Y, and four third sides sequentially connected to the two first sides E1 and the two second sides E2. In the same pixel unit, two of the third sub-pixels 203 are respectively disposed close to the two first sides E1, and the first sub-pixel 201 and the second sub-pixel 202 are respectively disposed close to the two second sides E2.

Further, an arrangement direction of the first sub-pixel 201 and the second sub-pixel 202 in the first pixel unit 21 is opposite to an arrangement direction of the first sub-pixel 201 and the second sub-pixel 202 in the third pixel unit 23. For example, the first sub-pixel 201 in the first pixel unit 21 is closer to one side of the top end of the two first sides E1 than the second sub-pixel 202 in the first pixel unit 21, and the first sub-pixel 201 in the third pixel unit 23 is closer to one side of the bottom end of the two first sides E1 than the second sub-pixel 202 in the third pixel unit 23. In the pixel layout of the whole display panel, the relationship of the inverted pixel positions as mentioned hereinabove is presented, so that the close packing of multiple pixel units 20 and multiple sub-pixels can be implemented in the pixel unit 20.

Optionally, the virtual octagon D has a regular octagon structure, and the coincident region C has a parallelogram structure; and the layouts of the first pixel unit 21 and the third pixel unit 23 adjacent to each other in the second direction Y have the partially coincident arrangement, and sides of two of the pixel units 20 adjacent to each other in the first direction X coincide with each other, thereby implementing the close packing of the pixel units 20. It should be understood that the pixel units 20 has the regular octagon structures such that the pixel units 20 are arranged in a seamless manner according to the above-mentioned arrangement law, thereby increasing the space availability of the display region of the display panel and increasing the pixel density thereof.

Further, in the pixel units 20 disposed adjacent to each other in the first direction X, the first sub-pixel 201 and the second sub-pixel 202 are arranged alternately.

Further, in each of the pixel units 20, the first sub-pixel 201 has an axial symmetrical structure, and is symmetrical about a connection line connecting a geometric center of the first sub-pixel 201 to a geometric center of the second sub-pixel 202. The second sub-pixel 202 also has the axial symmetrical structure, and is symmetrical about the connection line connecting the geometric center of the first sub-pixel 201 to the geometric center of the second sub-pixel 202. In addition, two of the third sub-pixels 203 are symmetrical about the connection line connecting the geometric center of the first sub-pixel 201 to the geometric center of the second sub-pixel 202.

Further, the pixel unit 20 is symmetrical about the connection line connecting the geometric center of the first sub-pixel 201 to the geometric center of the second sub-pixel 202.

The shapes of the first sub-pixel 201, the second sub-pixel 202 and the third sub-pixel 203 are not particularly restricted. Optionally, the first sub-pixel 201 has a polygonal, circular or elliptic shape, the second sub-pixel 202 has a polygonal, circular or elliptic shape, and the third sub-pixel 203 has a polygonal, circular or elliptic shape.

Further, the first sub-pixel 201 has a hexagonal shape, the second sub-pixel 202 and the third sub-pixel 203 have the tetragonal shapes, and the first sub-pixel 201, the second sub-pixel 202 and the third sub-pixel 203 are closely packed, thereby forming the pixel unit 20 having the virtual octagon structure.

Optionally, the virtual octagon D is a regular octagon, the first sub-pixel 201 has a hexagonal shape, the second sub-pixel 202 has a circular shape, and the third sub-pixel 203 has a parallelogram shape.

Optionally, the virtual octagon D is a regular octagon, the first sub-pixel 201 has a hexagonal shape, the second sub-pixel 202 has a rectangular shape, the third sub-pixel 203 has a parallelogram shape, and the first sub-pixel 201, the second sub-pixel 202 and the third sub-pixel 203 are commonly combined into the pixel unit 20 having the regular octagon structure. In this embodiment, the first sub-pixel 201 is configured to be hexagonal, the second sub-pixel 202 is configured to be rectangular, the third sub-pixel 203 is configured to have the parallelogram shape, and the first sub-pixel 201, the second sub-pixel 202 and the third sub-pixel 203 are closed packed to form the pixel unit having the regular octagon structure. Thus, it is possible to implement the close packing of the sub-pixels in each pixel unit, and to enhance an aperture ratio of each sub-pixel. So, it is beneficial to the increase of the overall pixel density of the display panel, to the enhancement of the display effect, and further to the increase of the service lifetime of the display panel.

Optionally, in the overall display panel, a ratio of an area of the first sub-pixel 201 to an area of the second sub-pixel 202 and an area of the third sub-pixel 203 is X1:Y1:Z1, where X1, Y1, Z1 are positive numbers. Preferably, X1 is any value selected from 0.1 to 5; X2 is any value selected from 0.1 to 5; and X3 is any value selected from 0.1 to 5.

Optionally, in each of the pixel units 20, areas of two of the third sub-pixels 203 are equal to each other, the area of the first sub-pixel 201 is greater than the area of the second sub-pixel 202. In addition, a distance from the geometric center of each of the third sub-pixels 203 to a geometric center of the first sub-pixel 201 is greater than a distance from the geometric center of the third sub-pixel 203 to the geometric center of the second sub-pixel 202.

In summary, the embodiment of this disclosure is configured to provide the pixel units 20 having octagon structures, to make two of the third sub-pixels 203 in each pixel unit 20 be distributed on two opposite sides of a pixel column constituted by the first sub-pixel 201 and the second sub-pixel 202, to make the first pixel unit 21 and the third pixel unit 23 share one of the third sub-pixels 203, and to make the first pixel unit 21 and the second pixel unit 22 be adjacent to each other without sharing, so that the display panel having the pixel structure can implement the close packing of multiple pixel units, the pixel density and the display resolution of the display panel are further increased, an aperture ratio of each sub-pixel is enhanced, and the service lifetime of the display panel can be advantageously increased.

Figure 4:
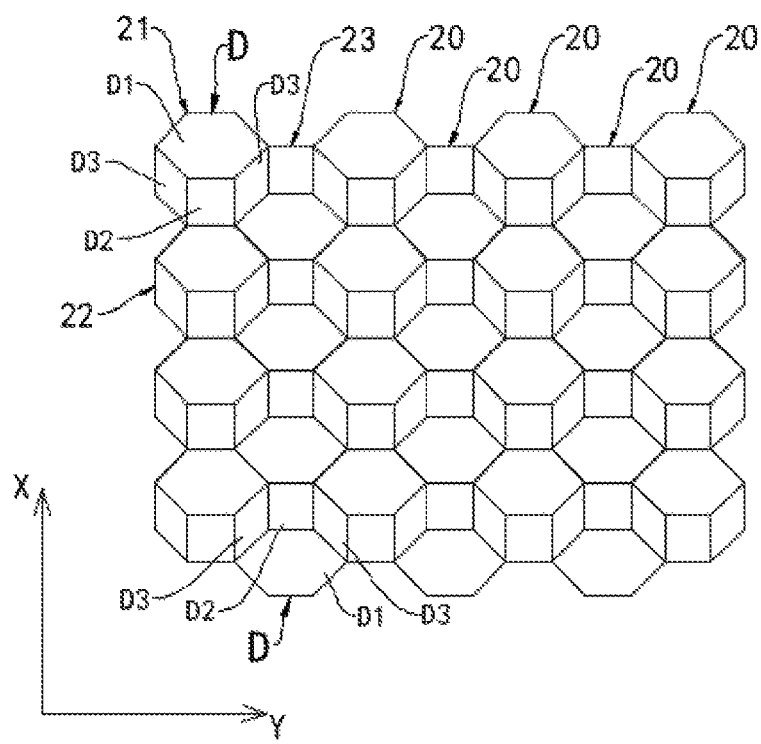
FIG. 4 is a schematic structure view showing a pixel in the display panel provided by the embodiment of this disclosure.

In an embodiment, please refer to FIG. 4, which is a schematic structure view showing a pixel in the display panel provided by the embodiment of this disclosure.

In this embodiment, the display panel further includes multiple pixel units 20, each of which is disposed in a virtual octagon D and has a first pixel region D1, a second pixel region D2 and two third pixel regions D3, and a sub-pixel is disposed in each pixel region. The second pixel region D2 and the first pixel region D1 in the pixel unit 20 are arranged in a first direction X, and two of the third pixel regions D3 are respectively disposed on two opposite sides of a pixel column constituted by the first pixel region D1 and the second pixel region D2 in the pixel unit 20.

The display panel includes a first pixel unit 21 and a second pixel unit 22 arranged and adjacent to each other in the first direction X, and a third pixel unit 23 adjacent to the first pixel unit 21 and the second pixel unit 22 concurrently. A third pixel region D3 of the first pixel unit 21 coincides with a third pixel region D3 of the third pixel unit 23.

The first pixel region D1 of the first pixel unit 21 is disposed close to a first end of the virtual octagon D, and the second pixel region D2 of the first pixel unit 21 is disposed close to a second end of the virtual octagon D. Correspondingly, the first pixel region D1 of the third pixel unit 23 is disposed close to the second end of the virtual octagon D, and the second pixel region D2 of the third pixel unit 23 is disposed close to the first end of the virtual octagon D, wherein the first end and the second end of the virtual octagon D are two opposite ends distributed in the first direction X in the virtual octagon D.

Further, the virtual octagon D is a regular octagon, the first pixel region D1 has a hexagonal shape, the second pixel region D2 has a rectangular shape, and the third pixel region D3 has a parallelogram shape.

Figure 5:
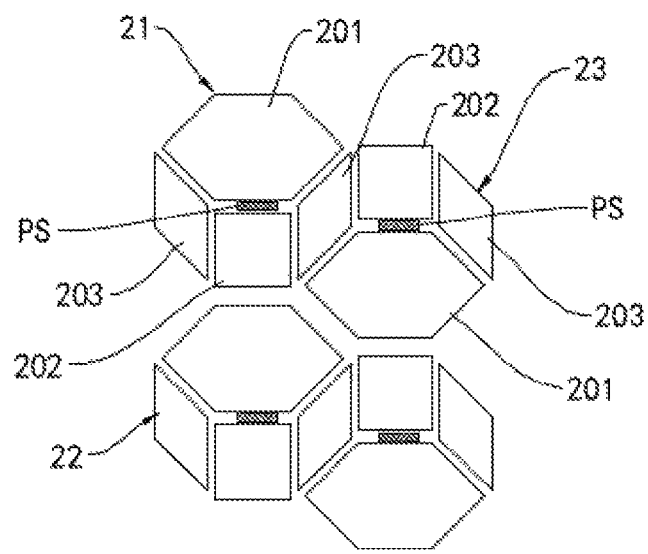
FIG. 5 is an enlarged partial view showing a first pixel structure in the display panel of FIG. 4.

According to an embodiment of this disclosure, please further refer to FIG. 5. FIG. 5 is an enlarged partial view showing a first pixel structure in the display panel of FIG. 4. In this embodiment, the first pixel region D1 is provided with a first sub-pixel 201, the second pixel region D2 is provided with a second sub-pixel 202, and each of the third pixel regions D3 is provided with one of the third sub-pixels 203. The first sub-pixel 201 has a hexagonal shape, the second sub-pixel 202 and the third sub-pixel 203 have tetragonal shapes, and the first sub-pixel 201, the second sub-pixel 202 and the third sub-pixel 203 are closely packed, thereby forming the pixel units 20 having virtual octagon structures.

Further, the virtual octagon D is a regular octagon, the first sub-pixel 201 has a hexagonal shape, the second sub-pixel 202 has a rectangular shape, the third sub-pixel 203 has a parallelogram shape, and the first sub-pixel 201, the second sub-pixel 202 and the third sub-pixel 203 are commonly combined into the pixel unit 20 having the regular octagon structure. The pixel unit and the above-mentioned structural characteristic of each sub-pixel in the pixel unit provided by this embodiment can advantageously increase the aperture ratio of the pixel of the display panel, further increase the overall pixel density of the display panel, enhance the display effect and increase the service lifetime of the display panel.

The first pixel unit 21 and the third pixel unit 23 partially coincide with each other, and the coincident region is one of the third sub-pixels 203. The first pixel unit 21 and the second pixel unit 22 are adjacent to each other and have no coincident region. In addition, in the pixel units 20 disposed adjacent to each other in the first direction X, the first sub-pixel 201 and the second sub-pixel 202 are arranged alternately.

In the same pixel unit 20, the second sub-pixel 202 and the first sub-pixel 201 in the pixel unit 20 are arranged in a first direction X; and two of the third sub-pixels 203 are respectively disposed on two opposite sides of a pixel column constituted by the first sub-pixel 201 and the second sub-pixel 202 in the pixel unit 20. The first pixel unit 21 and the third pixel unit 23 share one of the third sub-pixels 203; and no sub-pixel sharing is present between the first pixel unit 21 and the second pixel unit 22, and the second sub-pixel 202 of the first pixel unit 21 is adjacent to the first sub-pixel 201 of the second pixel unit 22.

Further, an arrangement direction of the first sub-pixel 201 and the second sub-pixel 202 in the first pixel unit 21 is opposite to an arrangement direction of the first sub-pixel 201 and the second sub-pixel 202 in the third pixel unit 23. In the pixel layout of the whole display panel, the above-mentioned relationship of the inverted pixel positions is present, so that the close packing of multiple pixel units 20 and multiple sub-pixels in the pixel unit 20 can be implemented.

Further, in each of the pixel units 20, the first sub-pixel 201 has the axial symmetrical structure, and is symmetrical about a connection line connecting the geometric center of the first sub-pixel 201 to the geometric center of the second sub-pixel 202. The second sub-pixel 202 also has the axial symmetrical structure, and is symmetrical about a connecting line connecting the geometric center of the first sub-pixel 201 to the geometric center of the second sub-pixel 202. In addition, two of the third sub-pixels 203 are symmetrical about a connection line connecting the geometric center of the first sub-pixel 201 to the geometric center of the second sub-pixel 202, and the pixel unit 20 is symmetrical about a connection line connecting the geometric center of the first sub-pixel 201 to the geometric center of the second sub-pixel 202.

Optionally, in each of the pixel units 20, areas of two of the third sub-pixels 203 are equal to each other, the area of the first sub-pixel 201 is greater than the area of the second sub-pixel 202. In addition, a distance from a geometric center of each of the third sub-pixels 203 to a geometric center of the first sub-pixel 201 is greater than a distance from the geometric center of the third sub-pixel 203 to the geometric center of the second sub-pixel 202.

Further, the display panel further includes support posts PS disposed between the first sub-pixels 201 and the second sub-pixels 202, wherein each of the support posts PS coincides with a connection line connecting a geometric center of the first sub-pixel 201 to a geometric center of the second sub-pixel 202.

In this embodiment, the support posts PS are disposed in the pixel units 20, and one of the support posts PS is disposed in each of the pixel units 20. In the overall display panel, a ratio of a number of the support posts PS to a number of the first sub-pixels 201 is equal to 1:1.

Figure 6:
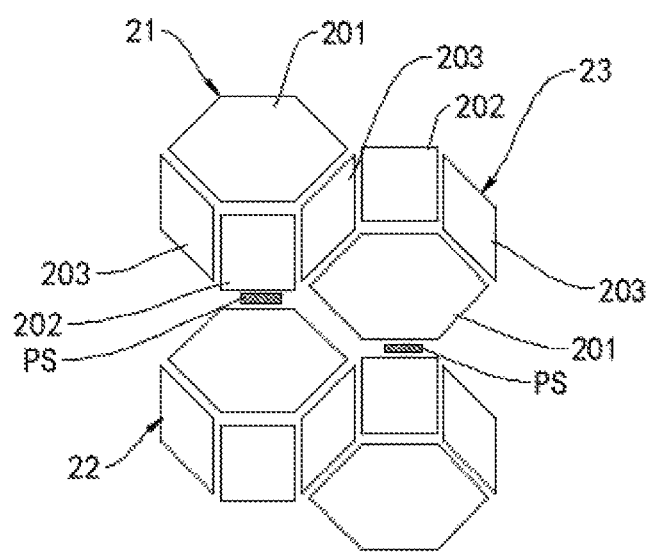
FIG. 6 is an enlarged partial view showing a second pixel structure in the display panel of FIG. 4.

In another embodiment, please refer to FIG. 6. FIG. 6 is an enlarged partial view showing a second pixel structure in the display panel of FIG. 4. The pixel structure shown in FIG. 6 and the pixel structure shown in FIG. 5 are basically the same except for the only difference in the configuration locations of the support posts PS. In the pixel structure shown in FIG. 6, the support post PS is disposed between two of the pixel units 20 adjacent to each other in the first direction X (i.e., between the first pixel unit 21 and the second pixel unit 22). Also, in the overall display panel, a ratio of a number of the support posts PS to a number of the first sub-pixels 201 is equal to 1:2.

Optionally, the support post PS orthogonally projected onto a light output surface of the display panel may have a polygonal, circular or elliptic shape.

Figure 7:
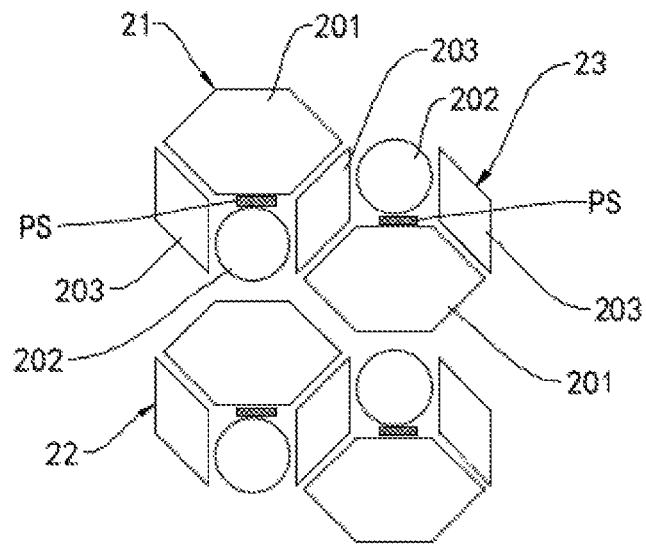
FIG. 7 is an enlarged partial view showing a third pixel structure in the display panel of FIG. 4.

According to an embodiment of this disclosure, please refer further to FIG. 7. FIG. 7 is an enlarged partial view showing a third pixel structure in the display panel of FIG. 4. The pixel structure of the display panel shown in FIG. 7 and the pixel structure of the display panel shown in FIG. 5 are basically the same except for the differences including, but without limitation to, the following aspects.

In this embodiment, the first pixel region D1 is provided with a first sub-pixel 201, the second pixel region D2 is provided with a second sub-pixel 202, and each of the third pixel regions D3 is provided with one of the third sub-pixels 203. The first sub-pixel 201 has a hexagonal shape, the second sub-pixel 202 has a circular shape, the third sub-pixels 203 have parallelogram shapes, and the first sub-pixel 201, the second sub-pixel 202 and the third sub-pixel 203 are commonly combined into a pixel unit 20 having the octagon structure.

In the same pixel unit 20, the second sub-pixel 202 and the first sub-pixel 201 in the pixel unit 20 are arranged in a first direction X; and two of the third sub-pixels 203 are respectively disposed on two opposite sides of a pixel column constituted by the first sub-pixel 201 and the second sub-pixel 202 in the pixel unit 20.

There is no coincident and shared sub-pixel between the first pixel unit 21 and the second pixel unit 22 arranged and adjacent to each other in the first direction. Meanwhile, the third pixel unit 23 adjacent to the first pixel unit 21 and the second pixel unit 22 and the first pixel unit 21 share one of the third sub-pixels 203. In the pixel units 20 disposed adjacent to each other in the first direction X, the first sub-pixel 201 and the second sub-pixel 202 are arranged alternately.

The first sub-pixel 201 of the first pixel unit 21 is disposed close to the first end of the virtual octagon D, and the second sub-pixel 202 of the first pixel unit 21 is disposed close to the second end of the virtual octagon D. Correspondingly, the first sub-pixel 201 of the third pixel unit 23 is disposed close to the second end of the virtual octagon D, and the second sub-pixel 202 of the third pixel unit 23 is disposed close to the first end of the virtual octagon D.

In each of the pixel units 20, the first sub-pixel 201 has an axial symmetrical structure, and is symmetrical about a connection line connecting a geometric center of the first sub-pixel 201 to a geometric center of the second sub-pixel 202. The second sub-pixel 202 also has the axial symmetrical structure, and is symmetrical about a connecting line connecting the geometric center of the first sub-pixel 201 to the geometric center of the second sub-pixel 202. In addition, two of the third sub-pixels 203 are symmetrical about a connection line connecting the geometric center of the first sub-pixel 201 to the geometric center of the second sub-pixel 202.

Optionally, in the overall display panel, a ratio of an area of the first sub-pixel 201 to an area of the second sub-pixel 202 and an area of the third sub-pixel 203 is X1:Y1:Z1, where X1, Y1, Z1 are positive numbers. Preferably, X1 is any value selected from 0.1 to 5, X2 is any value selected from 0.1 to 5, and X3 is any value selected from 0.1 to 5.

Optionally, in each of the pixel units 20, areas of two of the third sub-pixels 203 are equal to each other, and the area of the first sub-pixel 201 is greater than the area of the second sub-pixel 202. In addition, a distance from a geometric center of each of the third sub-pixels 203 to a geometric center of the first sub-pixel 201 is greater than a distance from the geometric center of the third sub-pixel 203 to a geometric center of the second sub-pixel 202.

The display panel further includes support posts PS disposed between the first sub-pixels 201 and the second sub-pixels 202, wherein each of the support posts PS coincides with a connection line connecting a geometric center of the first sub-pixel 201 to a geometric center of the second sub-pixel 202.

In this embodiment, the support posts PS are disposed in the pixel units 20, and one of the support posts PS is disposed in each of the pixel units 20. In the overall display panel, a ratio of a number of the support posts PS to a number of the first sub-pixels 201 is equal to 1:1.

Figure 8:
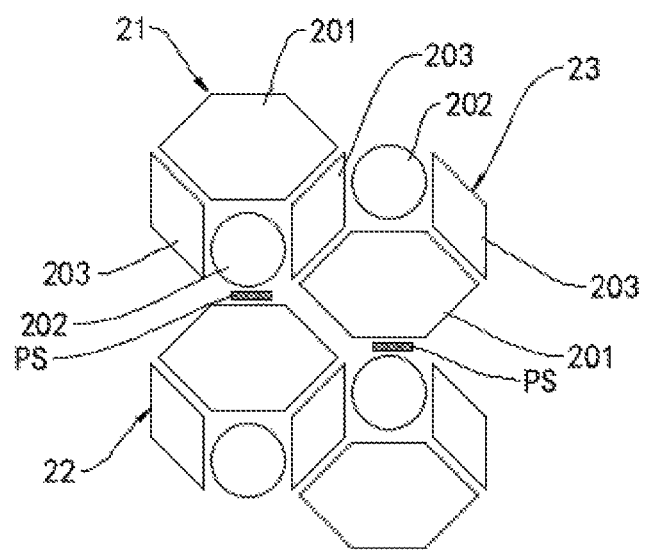
FIG. 8 is an enlarged partial view showing a fourth pixel structure in the display panel of FIG. 4.

In another embodiment, please refer to FIG. 8. FIG. 8 is an enlarged partial view showing a fourth pixel structure in the display panel of FIG. 4. The pixel structure shown in FIG. 8 and the pixel structure shown in FIG. 7 are basically the same except for only the difference in the configuration locations of the support posts PS. In the pixel structure of FIG. 8, the support post PS is disposed between two of the pixel units 20 adjacent to each other in the first direction X; and in the overall display panel, a ratio of a number of the support posts PS to a number of the first sub-pixels 201 is equal to 1:2. The support post PS orthogonally projected onto a light output surface of the display panel may have a polygonal, circular or elliptic shape.

It is to be described that although specific embodiments of this disclosure have been disclosed hereinabove, the above-mentioned embodiments are not used to limit this disclosure, and various modifications and decorations may be made by those of ordinary skill in the art without departing from the spirit and scope of this disclosure. Therefore, the protection scope of this disclosure is subject to the scope defined by the claims.

What is claimed is:

1. A display panel, comprising: multiple first sub-pixels displaying a first color, multiple second sub-pixels displaying a second color, and multiple third sub-pixels displaying a third color;
    wherein the display panel further comprises multiple pixel units each comprising one of the first sub-pixels, one of the second sub-pixels and two of the third sub-pixels disposed in a virtual octagon,
    wherein in each of the pixel units, the first sub-pixel is adjacent to the second sub-pixel in a first direction, and two of the third sub-pixels are arranged in a second direction and disposed on two opposite sides of a pixel column constituted by the first sub-pixel and the second sub-pixel;
    wherein the display panel comprises: a first pixel unit and a second pixel unit arranged and adjacent to each other in the first direction, and a third pixel unit adjacent to the first pixel unit and the second pixel unit concurrently, wherein the first pixel unit and the third pixel unit share one of the third sub-pixels, and the second sub-pixel of the first pixel unit is adjacent to the first sub-pixel of the second pixel unit.

2. The display panel according to claim 1, wherein the first sub-pixel of the second pixel unit is adjacent to the first sub-pixel of the third pixel unit.

3. The display panel according to claim 1, wherein the first pixel unit and the second pixel unit does not share the first sub-pixel or the second sub-pixel.

4. The display panel according to claim 1, wherein an arrangement direction of the first sub-pixel and the second sub-pixel in the first pixel unit is opposite to an arrangement direction of the first sub-pixel and the second sub-pixel in the third pixel unit.

5. The display panel according to claim 1, wherein in each of the pixel units, areas of two of the third sub-pixels are equal to each other, and an area of the first sub-pixel is greater than an area of the second sub-pixel.

6. The display panel according to claim 5, wherein in each of the pixel units, a distance from a geometric center of each of the third sub-pixels to a geometric center of the first sub-pixel is greater than a distance from the geometric center of the third sub-pixel to a geometric center of the second sub-pixel.

7. The display panel according to claim 6, wherein in each of the pixel units, the first sub-pixel is symmetrical about a connection line connecting the geometric center of the first sub-pixel to the geometric center of the second sub-pixel, the second sub-pixel is symmetrical about the connection line connecting the geometric center of the first sub-pixel to the geometric center of the second sub-pixel, and two of the third sub-pixels are symmetrical about the connection line connecting the geometric center of the first sub-pixel to the geometric center of the second sub-pixel.

8. The display panel according to claim 1, wherein:
    the virtual octagon comprises two first sides parallel to the first direction, two second sides parallel to the second direction, and four third sides sequentially connecting the two first sides to the two second sides; and
    two of the third sub-pixels are respectively disposed close to the two first sides, and the first sub-pixel and the second sub-pixel are respectively disposed close to the two second sides.

9. The display panel according to claim 8, wherein the first sub-pixel has a polygonal, circular or elliptic shape, the second sub-pixel has a polygonal, circular or elliptic shape, and the third sub-pixel has a polygonal, circular or elliptic shape.

10. The display panel according to claim 9, wherein the first sub-pixel has a hexagonal shape, and each of the second sub-pixel and the third sub-pixel has a tetragonal shape.

11. The display panel according to claim 10, wherein:
    the virtual octagon is a regular octagon, the second sub-pixel has a rectangular shape, and the third sub-pixel has a parallelogram shape; and
    a coincident region between the virtual octagon where the first pixel unit is located and the virtual octagon where the third pixel unit is located has a parallelogram shape.

12. The display panel according to claim 9, wherein:
    the virtual octagon is a regular octagon, the first sub-pixel has a hexagonal shape, the second sub-pixel has a circular shape, and the third sub-pixel has a parallelogram shape; and
    a coincident region between the virtual octagon where the first pixel unit is located and the virtual octagon where the third pixel unit is located has a parallelogram shape.

13. The display panel according to claim 1, wherein the display panel further comprises support posts disposed between the first sub-pixels and the second sub-pixels.

14. The display panel according to claim 13, wherein each of the support posts is disposed on a connection line connecting a geometric center of the first sub-pixel to a geometric center of the second sub-pixel.

15. The display panel according to claim 14, wherein the support posts are disposed in the pixel units.

16. The display panel according to claim 15, wherein in the overall display panel, a ratio of a number of the support posts to a number of the first sub-pixels is equal to 1:1.

17. The display panel according to claim 14, wherein each of the support posts is disposed between two of the pixel units adjacent to each other in the first direction.

18. The display panel according to claim 17, wherein in the overall display panel, a ratio of a number of the support posts to a number of the first sub-pixels is equal to 1:2.

19. The display panel according to claim 1, wherein the first sub-pixel is a red sub-pixel, the second sub-pixel is a blue sub-pixel, and the third sub-pixel is a green sub-pixel.

20. A display panel, comprising: multiple first sub-pixels displaying a first color, multiple second sub-pixels displaying a second color, and multiple third sub-pixels displaying a third color;
    wherein the display panel further comprises multiple pixel units each comprising one of the first sub-pixels, one of the second sub-pixels and two of the third sub-pixels disposed in a virtual octagon;
    wherein in each of the pixel units, the first sub-pixel is adjacent to the second sub-pixel in a first direction, and two of the third sub-pixels are arranged in a second direction and disposed on two opposite sides of a pixel column constituted by the first sub-pixel and the second sub-pixel;
    wherein the display panel comprises: a first pixel unit and a second pixel unit arranged and adjacent to each other in the first direction, and a third pixel unit adjacent to the first pixel unit and the second pixel unit concurrently, wherein the first pixel unit and the third pixel unit share one of the third sub-pixels, the second sub-pixel of the first pixel unit and is adjacent to the first sub-pixel of the second pixel unit, and the first sub-pixel of the second pixel unit is adjacent to the first sub-pixel of the third pixel unit;

wherein an arrangement direction of the first sub-pixel and the second sub-pixel in the first pixel unit is opposite to an arrangement direction of the first sub-pixel and the second sub-pixel in the third pixel unit.

\* \* \* \* \*